United States Patent [19]
Pickerd

[11] Patent Number: 5,978,742
[45] Date of Patent: *Nov. 2, 1999

[54] METHOD AND APPARATUS FOR DIGITAL SAMPLING OF ELECTRICAL WAVEFORMS

[75] Inventor: John J. Pickerd, Hillsboro, Oreg.

[73] Assignee: Tektronix, Inc., Wilsonville, Oreg.

[ * ] Notice: This patent issued on a continued prosecution application filed under 37 CFR 1.53(d), and is subject to the twenty year patent term provisions of 35 U.S.C. 154(a)(2).

[21] Appl. No.: 08/833,150

[22] Filed: Apr. 4, 1997

[51] Int. Cl.$^6$ ............................ G01R 13/20; G01R 13/00
[52] U.S. Cl. ........................... 702/66; 324/121 R; 702/67
[58] Field of Search ..................... 364/487, 481; 324/121 R; 702/66, 67

[56] References Cited

U.S. PATENT DOCUMENTS

| | | | |
|---|---|---|---|
| 4,495,586 | 1/1985 | Andrews | 364/487 |
| 4,743,844 | 5/1988 | Odenheimer et al. | 324/121 |
| 4,758,963 | 7/1988 | Gordon et al. | 364/481 |
| 4,797,936 | 1/1989 | Nakatsugawa et al. | 382/1 |
| 4,825,379 | 4/1989 | Luthra et al. | 364/487 |
| 5,714,878 | 2/1998 | Saito et al. | 324/121 |

*Primary Examiner*—Ayaz R. Sheikh
*Assistant Examiner*—Tim T. Vo
*Attorney, Agent, or Firm*—Garth E. Janke; Thomas F. Lenihan

[57] ABSTRACT

A method and apparatus for digitally sampling electrical waveforms. A sampling circuit for sampling an electrical signal, a digitizing circuit for digitizing the samples produced by the sampling circuit and an acquisition memory for storing the samples are employed, the acquisition memory being partitioned into a plurality of frames. Each frame is triggered to store samples associated with a respective triggering event. After substantially all of the frames have been triggered, the contents of the acquisition memory are retrieved from the acquisition memory, filtered in an equalization filter and stored in a waveform memory for ultimate display as an ET record under software control. A plurality of digitizing circuits associated with respective inputs of a multi-channel digital sampling oscilloscope are interleaved to increase the sampling rate.

21 Claims, 5 Drawing Sheets

METHOD AND APPARATUS FOR DIGITAL SAMPLING OF ELECTRICAL WAVEFORMS

BACKGROUND OF THE INVENTION

This invention relates to the digital sampling of electrical waveforms. More particularly, the invention relates to providing, in a digital sampling oscilloscope, an effectively increased and controllably shaped pass-band through software control of existing hardware.

It is necessary in signal measuring instruments generally to provide a sufficient bandwidth in the instrument to respond to the highest frequencies of a signal to be measured within acceptable limits of distortion. As is well known, measuring instruments generally lose this capability at high enough frequencies, their response becoming substantially attenuated and phase shifted past a 3 db, break or cut-off frequency.

A standard approach to increasing the bandwidth of a signal measuring instrument is to employ faster circuitry to increase the physical sampling rate. However, faster circuitry has the disadvantage of higher cost; especially so where there are multiple channels in each of which it is desired to provide higher speed.

An alternative approach has been to provide for what is known in the art as equivalent time sampling ("ET" and "ET mode"). In ET mode, advantage is taken of the periodic nature of the waveform to be sampled wherein multiple, sequential acquisitions of samples of the waveform are acquired and employed to increasingly build up a higher resolution record of the period of the waveform. The samples in one acquisition are generally acquired asynchronously with the samples of other acquisitions so they do not overlap.

The number of acquisitions employed in ET mode can be seen to be the factor by which time is effectively expanded ("time expansion factor") or the factor by which the physical sampling rate is effectively multiplied. That is, a greater physical time is provided during which samples of the waveform are acquired so that, for a given period of the waveform, more samples are acquired. However, the greater physical time is provided by sampling over repeated periods of the waveform. Accordingly, it can be appreciated that ET sampling cannot generally be employed in the sampling of non-periodic waveforms.

Digital sampling oscilloscopes often provide for an ET mode. An acquisition memory register is typically arranged in a circular queue. Digitizing circuits write to the memory register at a substantially constant rate with samples of a waveform. When a triggering event triggers the oscilloscope, a predetermined number of samples are written into the memory register, whereafter sampling is ceased. The predetermined number of samples corresponding to the triggering event forms an "acquisition."

Trigger location information employed to locate the trigger and, hence, the start of the desired data in the acquisition memory is stored in a separate memory register. The contents of the acquisition memory register corresponding to a particular acquisition may then be located and moved into an ET record for ultimate display to a user of the oscilloscope.

Typically, software is responsible to locate, move and otherwise process an acquisition for display. Some of the software instructions (an "instruction set") are executed in proportion to the number of samples acquired, while some of the instructions are executed in proportion to the number of acquisitions, regardless of the number of samples in the acquisition. The latter instructions are, therefore, overhead with respect to the samples. Typically, overhead is a very large percentage of the total instruction set.

Moreover, in standard operation of the oscilloscope, the aforementioned instructions are invoked for one acquisition, one acquisition being an essentially complete result for display. However, in ET mode, where multiple acquisitions are required to provide the desired resulting display, the instructions must be invoked multiple times, i.e., for each acquisition. Therefore, it can be appreciated that ET mode not only employs a lower physical sampling rate, resulting in fewer samples per acquisition, but sacrifices significant speed as well by multiplying the overhead as a result of employing multiple acquisitions.

Digital sampling oscilloscopes also may provide for a "fast frame" mode. The acquisition memory register is partitioned into a number of frames or segments. Typically, the samples for a first acquisition are stored in one of the segments and the samples of next acquisitions are stored in following segments before invoking the aforedescribed overhead. With the overhead now amortized over a number of acquisitions, the effective sampling rate of the oscilloscope may be greatly increased. The acquisitions are concatenated for ultimate presentation to the user on the display. While this methodology provides for an increased sampling rate by decreasing the effective overhead for a given acquisition, the effective sampling rate remains limited by the speed of sampling and digitizing hardware.

Digital sampling oscilloscopes are sometimes employed to provide a so-called "eye diagram" for mask testing of a digital bit stream. Here, the signal being measured is generally non-periodic. The "eye" pattern, inter alia, displays the shape of the edges of the digital pulses representing bits of data. Consequently, acceptable resolution of eye diagram patterns requires a sampling frequency of at least twice the frequency of the Fourier components forming the edges of the digital pulses. Accordingly, it is especially advantageous in an eye diagram pattern to employ a digital sampling oscilloscope with a relatively capacious bandwidth compared to the bit rate.

Such eye pattern diagrams may be used for analysis of optical waveforms such as Synchronous Optical Networks and Fibre Channel optical waveforms ("SONET/Fibre Channel"), particularly mask testing. In such mask testing, standards are typically employed which specify the frequency response of a reference receiver (hereinafter "reference channel"), such as a digital sampling oscilloscope employed for constructing an eye pattern diagram. For example, the ITU-TS G 957 standard specifies a reference receiver having a 4th order Bessel-Thompson ("BT") frequency response whose 3 db bandwidth is selected to be 0.75 times the bit rate.

The reference channel generally includes a digital sampling oscilloscope, a probe connected to electrical inputs of the digital sampling oscilloscope, and a filter for equalizing the reference channel to substantially match the desired BT frequency response. Typically, the digital sampling oscilloscope employs a bandwidth that comfortably exceeds the desired frequency response. An example of such a digital sampling oscilloscope employed for optical mask testing is the HP 71501, manufactured by Hewlett Packard Company of Palo Alto, Calif. Typically as well, the probe is provided a bandwidth which exceeds the bandwidth of the desired BT response. Then, an expensive but standardized, outboard hardware filter is typically employed to shape the pass-band of the reference channel to fall off with the BT response. On the other hand, if the cut-off frequency of either the probe or the scope, or both, is in the region of the desired BT response, the hardware filter must, in addition, be tailored to the particular frequency response characteristics of the reference channel.

It is often undesirable to incur the cost of employing a reference channel having a sufficiently high frequency response to permit use of the standardized filter. This is particularly so where the bit rate is as high as 622 Mb/s, as for some SONET/Fibre Channel signals. And while a customized filter can generally be employed to obtain the desired frequency response in the reference channel, the disadvantages of requiring an expensive, customized filter for each combination of probe and scope are readily apparent.

Accordingly, there is a need for a method and apparatus for digital sampling of electrical waveforms that provides, at relatively low cost in a digital sampling oscilloscope, increased effective bandwidth and, for some applications, that combines increased effective bandwidth with improved control over the shape of the pass-band of the digital sampling oscilloscope.

SUMMARY OF THE INVENTION

The method and apparatus for digital sampling of electrical waveforms of the present invention solves the aforementioned problems and meets the aforementioned needs by employing a sampling circuit for sampling an electrical signal, a digitizing circuit for digitizing the samples produced by the sampling circuit and an acquisition memory for storing the samples, the acquisition memory being partitioned into a plurality of segments. Each segment is triggered to store samples associated with a particular triggering event. After substantially all of the segments have been triggered, the contents of the acquisition memory are retrieved from the acquisition memory, processed, and stored in a waveform memory for ultimate display as an ET record under software control. This effectively amortizes the overhead associated with the software over a plurality of triggering events and results in a significantly higher speed than is provided by standard ET mode which invokes the aforementioned software overhead for each triggering event.

The contents of each segment of the acquisition memory are filtered in an equalization filter, preferably an adaptive FIR filter, after being read from the acquisition memory and before being stored in the waveform memory for display. The equalization filter is provided for controlling the shape of the pass-band of the reference channel. More particularly, the equalization filter is advantageously employed to match the frequency response of the reference channel to a fourth order BT response as is known in the art for SONET/Fibre Channel optical signal mask testing.

The method and apparatus preferably further employ, in a multi-channel digital sampling oscilloscope, a plurality of digitizing circuits associated with the channels, wherein a number of the digitizing circuits may be selectably applied to a selected one of the channels and interleaved, to increase the sampling rate of the channel in substantial proportion to the number of digitizing circuits so applied.

Therefore, it is a principal object of the present invention to provide a novel and improved method and apparatus for digitally sampling electrical waveforms.

It is another object of the present invention to provide such a method and apparatus which provides for increasing the effective bandwidth of an existing digital sampling oscilloscope.

It is still another object of the present invention to provide such a method and apparatus which provides for a high speed equivalent time mode in a digital sampling oscilloscope.

It is yet another object of the present invention to provide such a method and apparatus which provides for controllably and cost effectively shaping the pass-band of a digital sampling oscilloscope.

It is a further object of the present invention to provide such a method and apparatus which provides for effectively increasing and controllably shaping the pass-band of a digital sampling oscilloscope through software control of existing hardware.

It is still a firther object of the present invention to provide such a method and apparatus which provides for improved capability in a digital sampling oscilloscope for mask testing of optical signals.

It is still a further object of the present invention to provide such a method and apparatus in a multi-channel digital sampling oscilloscope having associated with each channel a digitizing circuit, the method and apparatus providing for selectably applying a number of the digitizing circuits to a selected one of the channels, for increasing the sample rate of the selected channel in substantial proportion to the number of digitizing circuits so applied.

The foregoing and other objects, features and advantages of the present invention will be more readily understood upon consideration of the following detailed description of the invention, taken in conjunction with the following drawings.

DETAILED DESCRIPTION OF A PREFERRED EMBODIMENT

Figure 1A:
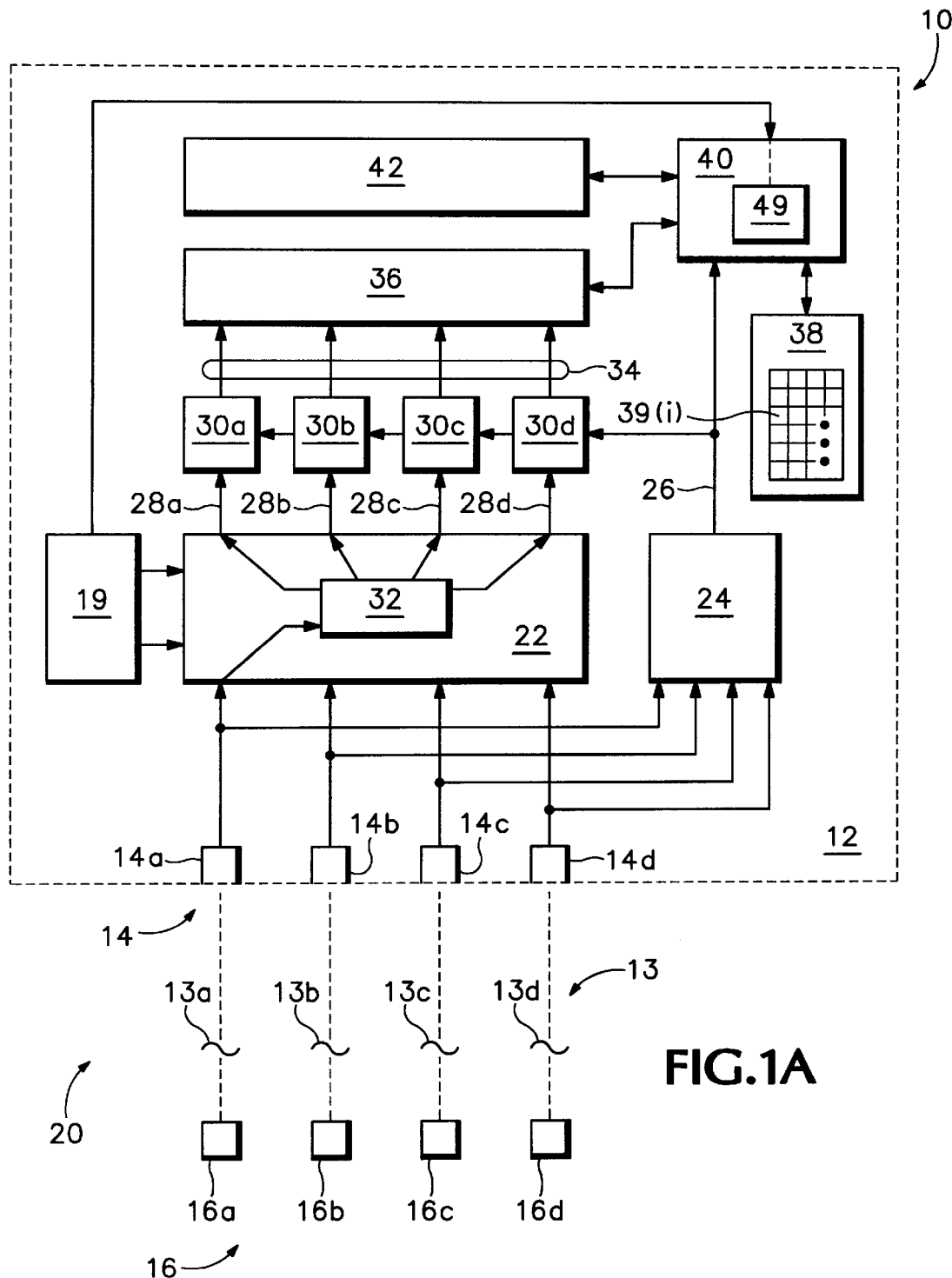
FIG. 1A is a block diagram of an apparatus for digitally sampling electrical waveforms according to the present invention.
Figure 1B:
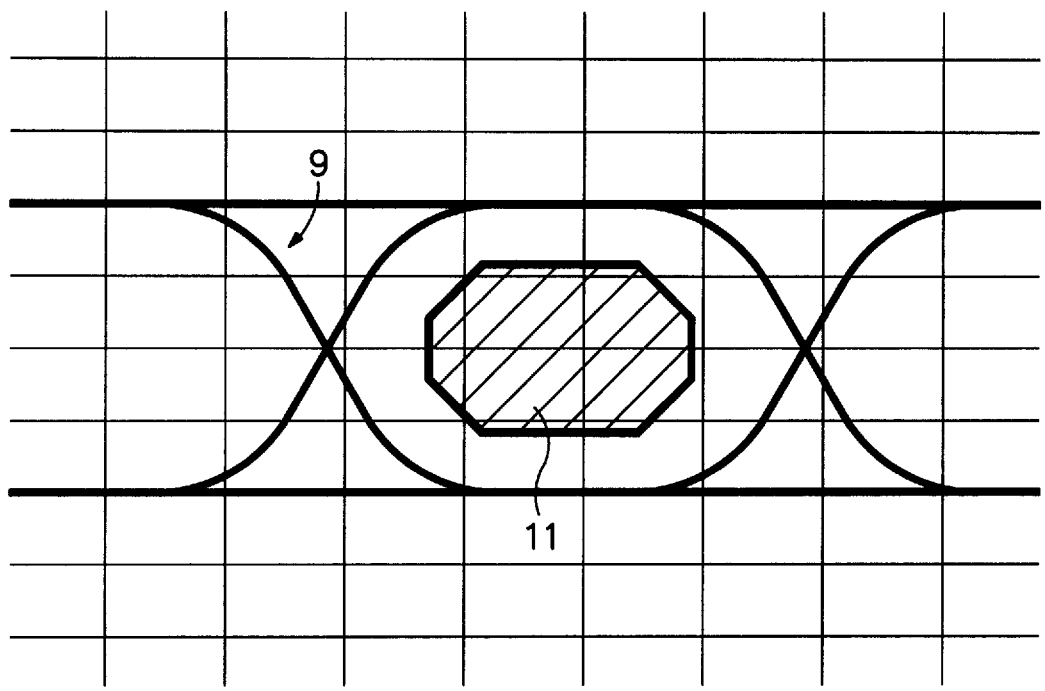
FIG. 1B is a pictorial view of a display of a digital sampling oscilloscope employed for mask testing of an optical signal.

Referring to FIG. 1A, a preferred embodiment of an apparatus 10 for digitally sampling electrical waveforms according to the present invention is preferably employed in an existing digital sampling oscilloscope 12, to significantly improve the performance of the oscilloscope 12 at relatively low cost. The electrical waveform may be any analog or digital signal 13. However, the invention is particularly advantageous for mask testing of SONET/Fibre Channel optical signals. Referring to FIG. 1B, an exemplary display of the oscilloscope 12, showing an eye-pattern diagram 9 for use in mask testing of an optical signal with a mask 11 is shown in FIG. 1B.

The oscilloscope 12 preferably includes multiple electrical inputs 14a, 14b, 14c and 14d for receiving a plurality of electrical signals to be sampled and displayed by the oscilloscope 12. Any number of electrical inputs may be employed, however, including one electrical input, without departing from the principles of the invention.

The electrical inputs are typically electrically connected to respective detachable scope probes 16a, 16b, 16c and 16d, the probes being adapted to couple electromagnetically with a source of electromagnetic energy to be measured. The electromagnetic energy to which the probes electromagnetically couple may be, for example, optical electromagnetic energy in the form of an optical signal. When employed as a reference receiver for an optical channel, such as for transmitting a SONET/Fibre Channel optical signal, the probes 16a–16d couple to selected optical signals and provide at their output an associated electrical signal 13 that is, within the pass-band of the probes, substantially proportional in amplitude and phase to the optical signal.

However, the probes 16a–16b often have a frequency response that breaks at or near the bit rate of the signals, which may be about 622 Mb/s for SONET/Fibre Channel signals. Moreover, the oscilloscope 12 may also have a frequency pass-band that breaks at or near the fundamental frequency or the bit rate of the signal. The apparatus 10 is especially adapted for use with such an oscilloscope 12 and probes 16 which together form a reference channel 20 having a frequency response that breaks at or near the bit rate of high digital bit rate signals such as SONET/Fibre Channel signals having a bit rate of 622 Mb/s.

The electrical inputs 14a–14d are provided to a sampling circuit 22 and a trigger circuit 24. The sampling circuit 22 samples electrical signals 13a, 13b, 13c and 13d at respective inputs 14a, 14b, 14c and 14d at regular, discrete times determined by a sampling clock 19 having a sampling rate of preferably at least about 4 GS/s. While a 4 GS/s sampling rate will be presumed for explanation herein, it will be understood that the sampling rate may be greater than or less than 4 GS/s without departing from the principles of the invention. The sampling circuit produces respective sample outputs 28a, 28b, 28c and 28d.

The trigger circuit 24 is set to provide at its output a trigger signal 26 upon a predetermined trigger condition met by of one or more of the electrical signals 13 as they appear at the inputs 14a–14d (a "triggering event"). An associated number of samples of the electrical signal acquired in response to a triggering event is hereafter termed an acquisition of an electrical signal 13.

The apparatus 10 includes digitizing circuits 30a, 30b, 30c and 30d to which are provided the sample outputs 28a–28d and which are associated with the electrical inputs 14a, 14b, 14c and 14d respectively. The digitizing circuits are typically capable of digitizing at a rate of only about 1 GS/s, which is typically less than the capacity of the sampling circuit 22. Therefore, like the electrical inputs there may be any number of the digitizing circuits 30, however, the apparatus 10 advantageously employs a digitizing circuit for each electrical input 14.

The sampling circuit 22 includes a channel connector 32 for connecting a selected one of the electrical signals to a selected one or more of the digitizing circuits 30. The digitizing circuits are interleaved, as is known in the art, to provide for an increase in digitizing speed on a selected input that is substantially proportional to the number of digitizing circuits 30 employed (the "interleave factor"). Thence, for example, four aligned and interleaved digitizers as shown in FIG. 1A provide for an interleave factor of 4 and substantially about a 4 GS/s digitizing rate to substantially match the sampling rate of the sampling circuit 22 and thereby provide for a maximum sampling capacity with respect to the selected electrical input. In FIG. 1A, the channel connector 32 is shown connecting the input 14a to all four of the digitizers 30 to provide for this maximum sampling capacity.

Figure 2:
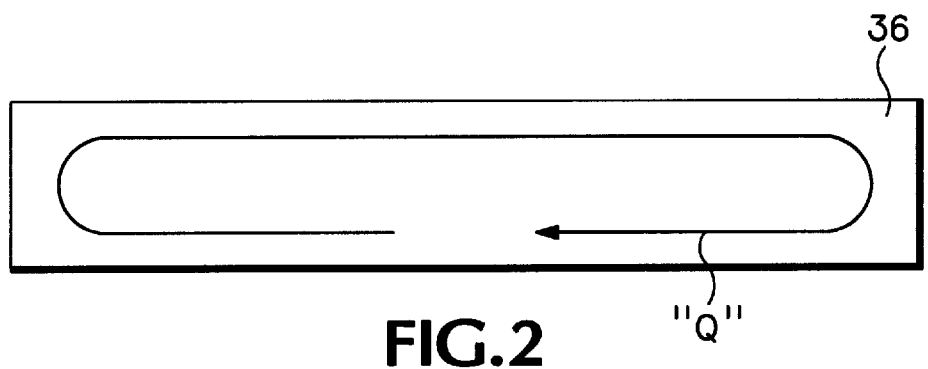
FIG. 2 is a block diagram of a prior art acquisition memory register.

The interleaved digitizing circuits 30 provide an output 34 that is applied to an acquisition memory register 36. Referring to FIG. 2, an acquisition memory register 36 is typically provided in the oscilloscope 12, the acquisition memory register being arranged as a circular queue "Q" of typically about 130 k words or samples.

In prior and normal operation of the oscilloscope 12, whether in normal mode or ET mode, the digitizing circuits 30 write to the acquisition memory, at a substantially constant rate, until the trigger signal 26 signals a triggering event. After receipt of a trigger, the digitizing circuits continue to write to the acquisition memory with a predetermined number of samples. Associated triggering information from which the location in the acquisition memory of the triggered acquisition can be determined is stored in a trigger memory 38. After the samples are acquired, the digitizing circuits 30 are disabled from writing to the acquisition memory in anticipation of processing of the acquisition.

In standard operation of the oscilloscope 12, the samples are acquired at a sufficiently high rate with respect to the frequency of the electrical signal 13 that all of the samples representing the signal may be acquired within a single period of the signal. In ET mode, however, the sampling rate is not high enough for acquisition of the desired number of samples in a period. The samples must therefore be acquired during a plurality of periods of the signal and combined, acquisition by acquisition, to build a record of the signal. For purposes of explanation herein, it is presumed that 500 samples are to be acquired in response to one triggering event in ET mode. However, the number of samples to be acquired will generally depend upon the sampling rate and the frequency of the electrical signal 13.

In an acquisition, the samples are acquired, preferably, sequentially in the acquisition memory register 36, though the acquisitions may be stored in the memory register in any order. Time information, however, is not maintained in the memory register. Instead, a time spacing between samples is understood. For example, for sequential storage it is understood that adjacent samples are spaced apart in time by the physical sampling period.

After acquiring the 500 samples, a processing cycle is initiated. The processing cycle is typically implemented in software. A processor 40 reads the trigger information stored in the trigger memory 38 and determines where to begin reading the samples in the acquisition memory register 36. The processor then reads the samples and, in prior and normal operation of the oscilloscope 12, processes the samples for writing to a waveform memory register 42, to form an ET record of the period of the electrical signal 13.

Figure 3A:
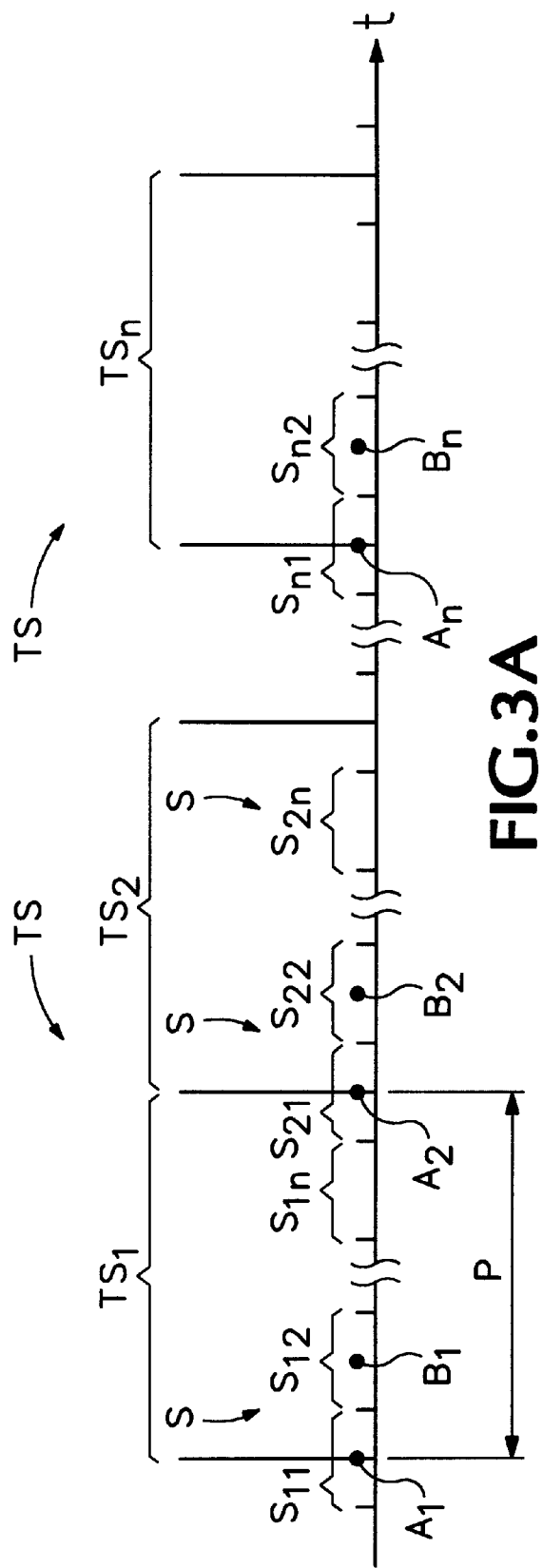
FIG. 3A is a time axis plot for defining time segments and slots as used herein.

The samples are combined after being retrieved from the acquisition memory register 36 for placing into a waveform memory register 42. Referring to FIG. 3A, samples are acquired at the sampling frequency, so that each sampling period "P" bounds a time segment "TS" between contiguously acquired samples. The time segments, therefore, have lengths "P." Since the samples of each acquisition are acquired at the sampling frequency, each sample of an acquisition corresponds to a separate one of the time segments.

For ET mode, each of the time segments "TS" is partitioned into a discrete number of time slots "s", for receiving the samples of additional acquisition. That is, there are preferably N time slots per time segment for N acquisitions. The width of the time slots is therefore substantially equal to the length "P" of the time segments divided by N. Thence, the aforedescribed time expansion factor equals the number of slots as well as the number of acquisitions, and the number of slots into which it is desired to partition the time segments corresponds to a desired increase in the effective sampling rate.

Each time segment is partitioned in like manner, and the slots "s" of one time segment are associated with corresponding slots in the other time segments by forming one of the acquisitions. To illustrate, a first sample "A1" of a first acquisition is placed in a first slot "s 11" of a first time segment "TS1", while a second sample "A2" of the first acquisition is placed in a corresponding first slot "s21" of a second time segment "TS2". Similarly, a first sample "B1" of a second acquisition is placed in a second slot "s12" of the first time segment "TS1", while a second sample "B2" of the second acquisition is placed in a corresponding second slot "s22" of the second time segment "TS2". Where there are only two samples in the acquisitions, there are only two time segments, and where there are only two acquisitions, there are only two slots in each of the time segments. It can be seen that the samples corresponding to the first acquisition are interleaved with the samples of the second acquisition in a similar manner to the aforedescribed interleaving of the digitizing circuits 30.

Populating slots corresponding to a plurality of the acquisitions is referred to herein as "combining the acquisitions." It is preferable for combining that the samples of each acquisition are spaced in time from the samples of other acquisitions. Advantageously, while the samples are acquired at regular intervals that are synchronous with the sampling clock frequency, the triggering events are asynchronous with the sampling clock. Thence, the samples corresponding to one triggering event are generally spaced from the samples corresponding to another triggering event.

Figure 3B:
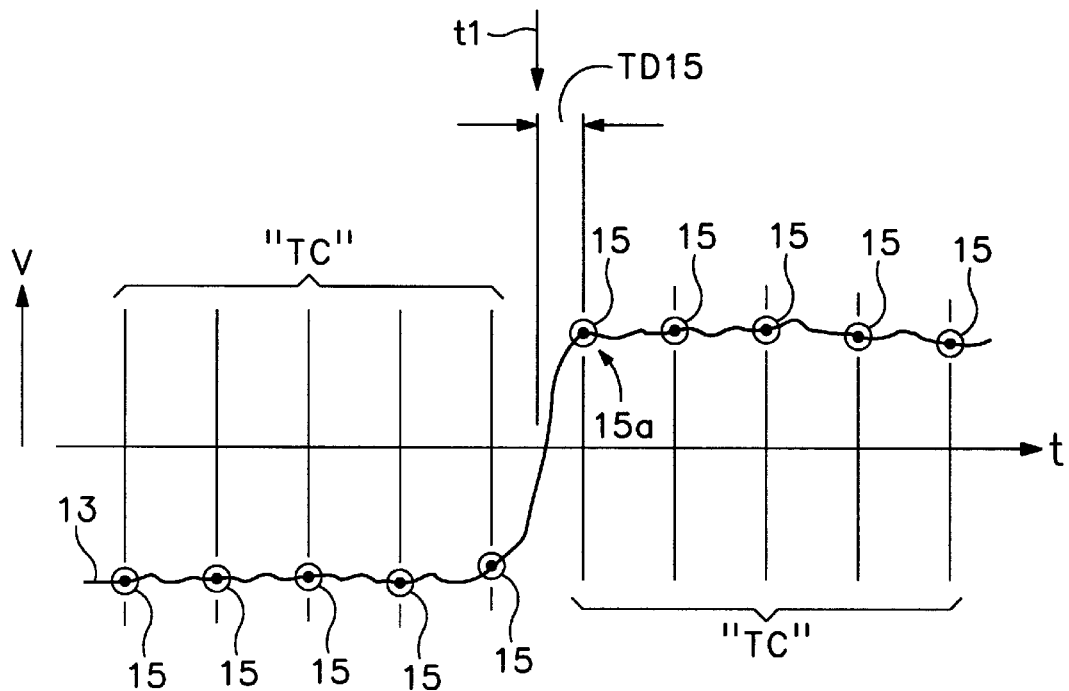
FIG. 3B is a plot of a magnitude versus time for a first acquisition of an electrical signal by the apparatus of FIG. 1.
Figure 3C:
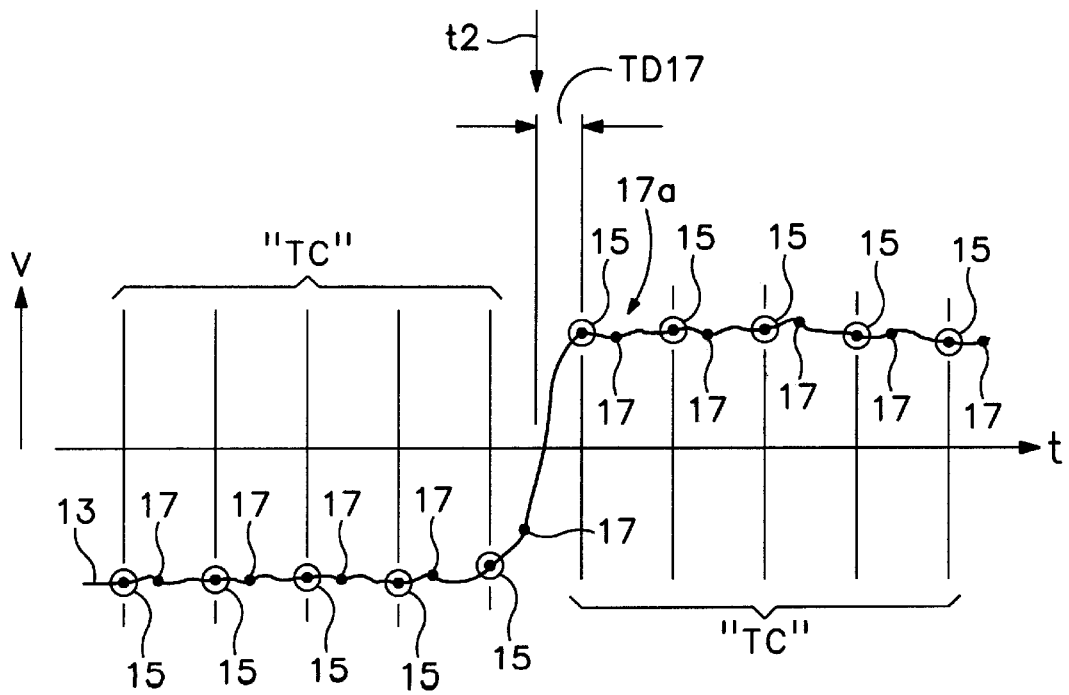
FIG. 3C is a plot of magnitude versus time for a second acquisition of the electrical signal of FIG. 3B by the apparatus of FIG. 1, the first acquisition of FIG. 3B being shown aligned with the second acquisition according to the present invention.

Referring to FIGS. 3B and 3C, combining the acquisitions includes adjusting or aligning the samples in time "t" to account for the asynchronicity of the acquisitions. That is, each acquisition is aligned with the slots corresponding thereto. A time interpolator 49 is provided in the processor 40 to measure the time between each triggering event and the next discrete time at which the samples corresponding to that triggering event are acquired. Such times arrive at the sampling clock frequency "TC". The time interpolator then computes a fractional value of the sampling interval corresponding to the relative position along the time axis of the samples therein. The samples associated with a given acquisition are then shifted along the time axis by an amount equal to the appropriate fractional value multiplied by the width of the sampling interval.

Illustratively, in FIG. 3B, a first sample 15a of an acquisition 15 is acquired at time t=TD15 after a trigger corresponding to a first time "t1" at which the signal 13 crosses a trigger level "V". Assume the time TD15 defines the slot "s11 " in FIG. 3A, so that the acquisition 15 is aligned with the slots corresponding thereto, i.e., the slots "s11," "s21, ". . . "sn1"in FIG. 3A. In FIG. 3C, a second sample 17a of an acquisition 17 is acquired at time t=TD17 after a second trigger corresponding to a second time "t2" at which the signal 13 crosses the trigger level. Assume the slots corresponding to the acquisition 17 are the slots "s12," "s22," . . . "sn2" in FIG. 3A. The time "t2" is typically, but not always, an integral number of periods of the signal after the time "t1". Since "t1" and "t2" represent the same time in an ET record, the samples of the acquisition 17 must be shifted with respect to the samples of the acquisition 15 a distance (TD17–TD15) on the time axis to align the acquisition 17 with respect to the acquisition 15 and, therefore, to the aforementioned slots corresponding thereto. The aligned acquisitions are provided to the waveform memory register 42 as the ET record.

The processor 40 must execute a number of instructions to locate and combine the acquisitions. As aforementioned, a subset of the total number of instructions is overhead, i.e., fixed with respect to the number of samples. In prior and normal operation of the oscilloscope 12 in ET mode, the acquisition memory register 36 in standard ET mode holds only the samples of a single acquisition, whether the number of the samples is 500 or 130,000, before the samples are processed for input to the ET record.

With a sampling and digitizing rate of 4 GS/s, obtained by interleaving four of the digitizing circuits 30, it can be seen that only about five samples of a 622 Mb/s SONET/Fibre Channel signal may be acquired during the period corresponding to the bit rate. Thence, the overhead would be invoked, in prior and normal operation of the oscilloscope 12 in standard ET mode, for each five samples, or one-hundred times for a 500 sample ET record.

Figure 4:
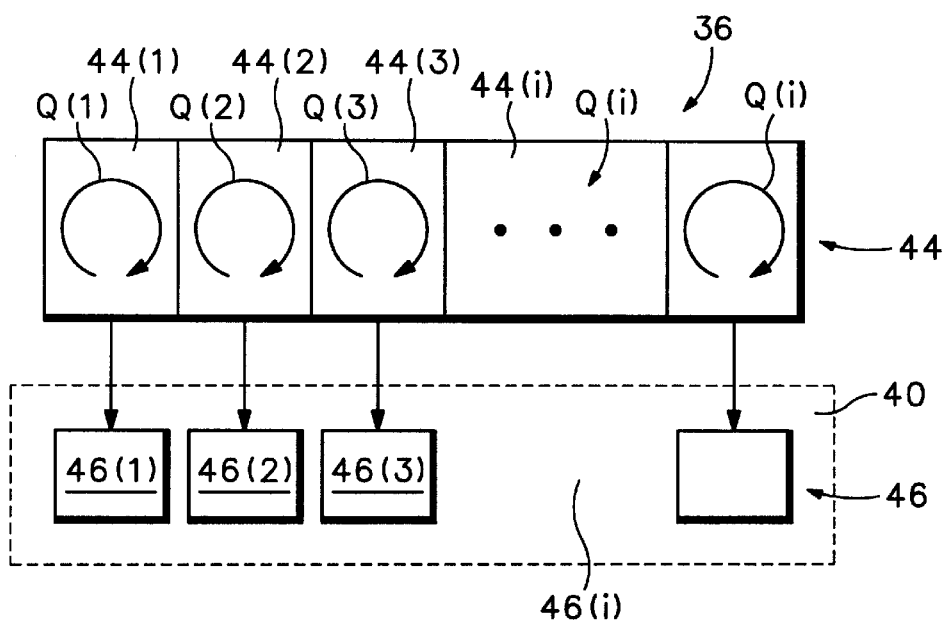
FIG. 4 is a block diagram of an acquisition memory register according to the present invention.

The present invention, however, provides for a high speed ET mode ("HSET"). Referring to FIG. 4, the acquisition memory register 36 is partitioned into a plurality of memory segments or frames 44(i) similar to fast frame mode. Each frame is arranged as a circular queue "Q(i)". For purposes of explanation only, the number of frames is presumed to be 100 for an acquisition memory register 36 having capacity for 500 samples and wherein 5 samples form an acquisition of the SONET/Fibre Channel signals. This provides for a time expansion factor of 100.

The digitizing circuits 30 write to a first frame 44(1) until a first triggering event signals acquisition of 5 samples in like manner to that aforedescribed. After the samples are stored in the first frame, the digitizing circuits 30 write to a second frame 44(2) until a second triggering event signals acquisition of another 5 samples. Only after all or a plurality of the 100 frames 44(i) likewise are provided the samples of their corresponding acquisitions is the processing cycle invoked and the overhead incurred. Thence, it can be seen that the overhead is now being amortized over all or a plurality of 100 triggering events rather than just one.

While partitioning the acquisition memory register 36 into a number of frames that substantially equals the time expansion factor is described as preferred, the number of frames may be more than or fewer than this number without departing from the principles of the invention.

Each frame 44(i) has associated therewith triggering information stored in a corresponding location 39(i) in the trigger memory 38, now arranged as an array. For the first frame 44(1), the processor 40 reads the trigger information from the location 39(1) in the trigger memory 38 and determines where to begin reading the samples in the frame 44(1). The processor reads the samples and, if desired, provides the samples to an equalization filter 46 as will be described below. After the processor reads the samples in the first frame, the processor reads the trigger information from the location 39(2) of the trigger memory 38 and determines where to begin reading the samples in the frame 44(2). The processor reads the samples corresponding to the second frame and, if desired, after the samples from the first frame is equalized, provides the samples corresponding to the second frame to the equalization filter 46. This routine is continued until all of the frames have been read and, if desired, presented to the equalization filter. After having been read from the frames, the acquisitions are combined as aforedescribed for presentation to the waveform memory register 42 and ultimate display as the ET record.

Figure 5:
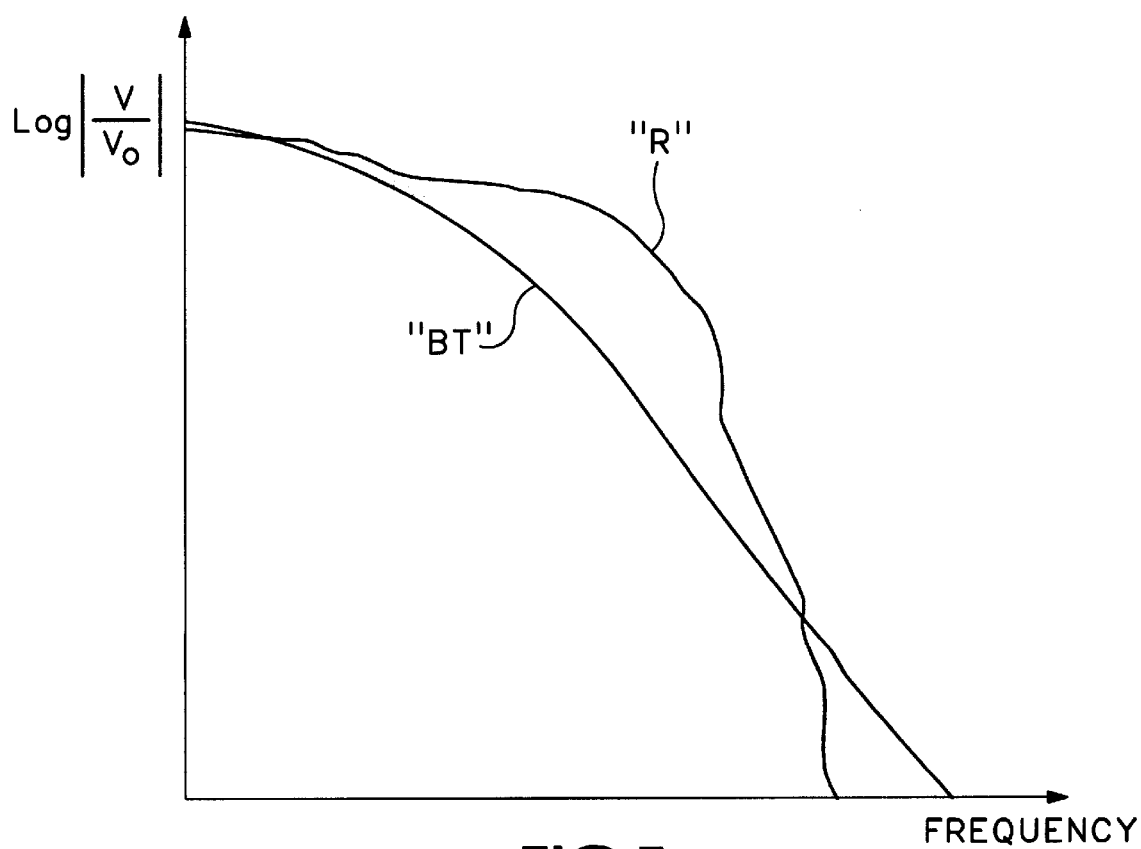
FIG. 5 is a plot of the logarithm of voltage versus frequency response for a Bessel Thompson filter and for a typical reference channel employed with the present invention.

It is one aim of the present invention to provide for an equalization, to desired frequency response spectral characteristics, of the reference channel 20. This is particularly true for SONET/Fibre Channel mask testing, where it is necessary to shape the high frequency response to roll-off as a fourth order Bessel Thompson (BT) filter to conform to various standards under the SONET/Fibre Channel signaling system. Referring to FIG. 5, a frequency response curve wherein the logarithm of voltage as a function of frequency is plotted is provided for the desired BT response as well as the typical response "R" of an unequalized reference channel 20.

Previously, equalization has been accomplished by connecting a specialized, outboard hardware filter between the probes 16 and the electrical inputs 14 of the oscilloscope 12. However, in the present invention the samples corresponding to the frames 44($i$) are equalized onboard, in the equalization filter 46, after being retrieved from the acquisition memory register 36 to achieve the same or a superior result.

In ET mode generally, and particularly for HSET mode eye pattern diagrams as in SONET/Fibre Channel mask testing where multiple triggering events are asynchronous with respect to the electrical signal 13, each sample should be equalized before being placed in the waveform memory register 42 for display. This is because the processor assembles for the waveform memory register 36 an ET record from independently acquired sets of samples, so that the timing relationship between the samples is not generally precisely maintained. Accordingly, the samples are preferably or necessarily equalized separately. Notwithstanding, the samples may be taken for equalization in a sequential or any other desired order.

Referring back to FIG. 4, preferably there is a filter 46($i$) associated with each frame 44($i$) of the acquisition memory register 36 to provide for separate equalization of the samples of separate acquisitions. However, the filter 46 is preferably implemented in software, so that the separate filters are realized as repeated runs of a subroutine.

The equalization filter 46 is preferably a generic FIR filter 48 having associated FIR filter coefficients W. The FIR filter coefficients are determined in a calibration method as follows.

The desired, BT response is defined by the transfer function:

$$G(s) = \frac{105}{s^4 + 10s^3 + 45s^2 + 105s + 105}$$

Samples $D_n$ of the impulse response of the BT filter are generated from:

$D_n = G(s)$, where $s = (n \cdot \Omega \cdot \text{cutoff})$, $n$ is an integer ranging from 0 to $N-1$;

$N$ = the number of samples to generate;

$$\Omega = \frac{2\pi j}{N}$$

cutoff = the desired cut-off frequency.

The actual impulse response of the reference channel 20 is sampled to form a second linear array X.

An optical impulse generator is used to generate an impulse for input to the reference channel 20. Illustratively, the impulse response X is acquired by with the digitizing circuits 30 in HSET to build a maximum 5 k sample record length at an ET sampling rate of 100 GS/s and decimating back to the physical sampling rate. Where interleaving of the digitizers 30 is employed, the ET sampling rate must be a multiple of the interleave factor.

An autocorrelation matrix R may next be formed as follows:

$$R_{m,n} = 1/N \sum_{k=L}^{N+L-1} (X_{k-m} \cdot X_{k-n})$$

where: m=integer ranging from 0 to N-1
L=Length of the FIR filter
And a cross correlation array P is formed as follows:

$$P_n = 1/N \sum_{k=L}^{N+L-1} (Dk \cdot X_{k-n})$$

The filter coefficients W are then determined from $R^{-1}$ or by Gauss-Jordan reduction. It has been found that a length of 19 points or taps in the filter 48 is generally adequate for equalizing a Digitizing Oscilloscope, such as any of the TDS Series 500 and Series 700 ("TDS") digitizing oscilloscopes manufactured and marketed by Tektronix Corp. of Beaverton, Oreg. ("Tektronix"), measuring an optical signal with an Optical Receiver also manufactured and marketed by Tektronix as Model P6703B. For a 19 point FIR filter, R has the dimension 19×19.

The filter coefficients W may be predetermined and placed in a memory 62. The memory 62 preferably provides for a maximum of 79 coefficients stored as 16 bit words for each filter. The memory 62 may be a protected, non-volatile memory. Alternatively, the FIR filter 48 the memory 62 may be unprotected or volatile. Then, the filter coefficients may be programmatically or otherwise updated in the field or even during operation of the oscilloscope 12. While an adaptive filter is advantageously employed as the filter 46, the filter need not have filter coefficients adapted in real time, or selected at repeated times. Rather, it is sufficient for practice of the invention that the coefficients may be selected once, preferably during manufacturing.

The filter coefficients are generally specific to each optical probe 16, to each attenuator setting, to each oscilloscope 12 and to each optical standard that is supported. Moreover, the frequency response spectral characteristics of a channel are found to vary with the gain settings of the oscilloscope, i.e., the step gain setting and the variable gain setting, the bandwidth of the channel as well as its operating temperature. The filter coefficients may be calibrated for specific such states or conditions or may be determined for selected average or nominal values for the states. When implemented in software as aforementioned, a large number of the filters 46 may be economically realized to provide for calibrating for a large number or all of the states.

Illustratively, for optical mask testing in a Tektronix TDS series digital sampling oscilloscope, there are seven supported mask standards, each requiring that the channel have a BT response and associated cut-off frequency. For each standard, fourteen of the aforedescribed equalization filters are provided as nominal or default filters, one for each of the attenuator settings 1X and 10X. The coefficients of the nominal filters are calculated for nominal values of the frequency response spectral characteristics of the oscilloscope and are, therefore, the same for each oscilloscope.

For a Tektronix TDS receiver including a probe having predetermined frequency response spectral characteristics, fourteen additional, calibrated filters are provided having filter coefficients particularly calibrated to the specified probe as well as selected states, such as optical mask standard and attenuation. More particularly, in the TDS oscilloscopes, calibrated coefficients for up to two specific optical probes of type P6701B or P6703B are provided for seven mask standards and two attenuator settings.

After being equalized in the equalization filter 46, the samples thereafter may be processed in any desired manner prior to entry into the waveform memory register 42 for ultimate display on the that, while a specific method and apparatus for digitally sampling electrical waveforms has been shown as preferred, other configurations could be utilized, in addition to configurations already mentioned, without departing from the principles of the invention.

The terms and expressions which have been employed in the foregoing specification are used therein as terms of description and not of limitation, and there is no intention of the use of such terms and expressions of excluding equivalents of the features shown and described or portions thereof, it being recognized that the scope of the invention is defined and limited only by the claims which follow.

I claim:

1. A method for sampling in a digital sampling oscilloscope, comprising the steps of:
   a) receiving an electrical signal;
   b) sampling said electrical signal at selected times;
   c) digitizing said samples;
   d) acquiring a predetermined number of said digitized samples in response to a trigger and forming a corresponding respective acquisition of said samples;
   e) storing each of said respective acquisitions in an acquisition memory without combining said respective acquisitions;
   f) repeating steps a) through e) a predetermined number of times to form a plurality of stored ones of said acquisitions;
   g) retrieving said plurality of acquisitions from said acquisition memory; and
   h) combining said plurality of acquisitions to form an equivalent time record.

2. The method of claim 1, further comprising, after said retrieving, selectably equalizing the digitized said samples and providing the equalized, digitized said samples for said combining.

3. The method of claim 1, wherein said electrical signal is an optical signal, the method further comprising displaying said equivalent time record on a display, and determining whether said equivalent time record is outside the boundaries of a predetermined mask area on said display.

4. The method of claim 2, further comprising providing a plurality of selectable frequency response spectral characteristics of said equalizing and selecting one or more of said plurality of characteristics.

5. The method of claim 3, further comprising equalizing the digitized said samples after retrieving said acquisitions from said acquisition memory and before combining said acquisitions.

6. The method of claim 4, wherein said selecting selectably equalizes the digitized said samples to compensate for a state of the digital sampling oscilloscope.

7. The method of claim 4, wherein said selecting selectably equalizes the digitized said samples to compensate for the bandwidth of the digital sampling oscilloscope.

8. The method of claim 4, wherein a probe is coupled to the digital sampling oscilloscope, the probe having a bandwidth, wherein said selecting selectably equalizes the digitized said samples to compensate for the bandwidth of the probe.

9. In an uncompensated channel of a digital sampling oscilloscope said uncompensated channel having uncompensated frequency response spectral characteristics that differ from desired frequency response spectral characteristics of a compensated channel, a method for compensating the, comprising the steps of:
   a) receiving an electrical signal;
   b) sampling said electrical signal at selected times;
   c) digitizing said samples;
   c) acquiring a predetermined number of the digitized said samples and forming a corresponding respective acquisition of said samples;
   d) storing each of said respective acquisitions in an acquisition memory without combining said respective acquisitions;
   e) repeating steps a) through e) a predetermined number of times to form a plurality of said acquisitions;
   f) retrieving said plurality of acquisitions from said acquisition memory;
   g) selectably equalizing the digitized said samples by providing a plurality of selectable frequency response filter characteristics, selecting one or more of said plurality of filter characteristics to compensate the channel for the frequency response spectral characteristics of the channel so as to cause the frequency response spectral characteristics of the channel to substantially match the frequency response spectral characteristics of the desired compensated channel, and filtering the channel with said one or more filter characteristics; and
   h) combining said plurality of acquisitions to form an equivalent time record.

10. The method of claim 9, wherein said equalizing compensates the channel to substantially match Bessel Thompson frequency response spectral characteristics.

11. The method of claim 9, wherein the channel includes an oscilloscope and a probe for sensing an electromagnetic signal, and wherein said equalizing compensates the channel for the frequency response spectral characteristics of said probe.

12. The method of claim 9, wherein the channel includes an oscilloscope, the method further comprising providing an attenuator setting of the oscilloscope, and wherein said equalizing compensates the channel for said attenuator setting.

13. The method of claim 9, wherein the channel includes an oscilloscope, the method further comprising providing a step gain setting of the oscilloscope, and wherein said equalizing compensates the channel for the frequency response spectral characteristics of said step gain setting.

14. The method of claim 9, wherein the channel includes an oscilloscope, the method further comprising providing a variable gain setting of the oscilloscope, and wherein said equalizing compensates the channel for the frequency response spectral characteristics of said variable gain setting.

15. The method of claim 9, wherein the channel includes an oscilloscope, the method further comprising providing a bandwidth of the oscilloscope, and wherein said equalizing compensates the channel for the frequency response spectral characteristics of said bandwidth.

16. The method of claim 9, wherein the channel includes an oscilloscope, the method further comprising providing an operating temperature range of the oscilloscope, and wherein said equalizing compensates the channel for the frequency response spectral characteristics of said operating temperature range.

17. The method of claim 9, wherein the channel includes an oscilloscope, the method further comprising providing a set of nominal parameters of the oscilloscope, and wherein said equalizing compensates the channel for the frequency response spectral characteristics of said nominal parameters.

18. The method of claim 9, wherein said filtering employs an FIR filter.

19. The method of claim 18, wherein said FIR filter is an adaptive filter.

20. The method of claim 18, further comprising providing said FIR filter with one or more FIR filter coefficients and calculating said FIR filter coefficients by sampling the impulse response of the channel to form a first array, forming a second array corresponding to samples of the desired impulse response, forming an autocorrelation matrix from said first and second arrays, forming a cross correlation array from said first and second arrays, and calculating filter coefficients by multiplying said cross correlation array by the inverse of said autocorrelation matrix.

21. A method for sampling in a digital sampling oscilloscope, comprising the steps of:

a) receiving an electrical signal at a plurality of A/D converters;

b) interleaving operation of said A/D converters to sample said electrical signal at selected times to produce digitized interleaved samples;

c) acquiring a predetermined number of said digitized interleaved samples in response to a trigger and forming a corresponding respective acquisition of said samples;

d) storing each of said respective acquisitions in an acquisition memory without combining said respective acquisitions;

e) repeating steps a) through e) a predetermined number of times to form a plurality of stored ones of said acquisitions;

f) retrieving said plurality of acquisitions from said acquisition memory; and g) combining said plurality of acquisitions to form an equivalent time record.

* * * * *